(12) United States Patent
Preusse

(10) Patent No.: US 7,400,131 B2
(45) Date of Patent: Jul. 15, 2008

(54) CURRENT SENSOR

(75) Inventor: Norbert Preusse, Alzenau (DE)

(73) Assignee: Vacuumschmelze GmbH & Co. KG, Hanua (DE)

( * ) Notice: Subject to any disclaimer, the term of this patent is extended or adjusted under 35 U.S.C. 154(b) by 82 days.

(21) Appl. No.: 11/554,366

(22) Filed: Oct. 30, 2006

(65) Prior Publication Data

US 2007/0252577 A1    Nov. 1, 2007

Related U.S. Application Data

(63) Continuation of application No. PCT/EP2005/004663, filed on Apr. 29, 2005.

(30) Foreign Application Priority Data

Apr. 30, 2004    (DE) .................. 10 2004 021 495

(51) Int. Cl.
*G01R 33/00* (2006.01)
(52) U.S. Cl. ............................................ 324/117 R
(58) Field of Classification Search .......... 324/117 R, 324/117 H, 765, 763, 158.1, 754, 761–762
See application file for complete search history.

(56) References Cited

U.S. PATENT DOCUMENTS

| | | |
|---|---|---|
| 3,812,428 A | 5/1974 | Trenkler .................. 324/127 |
| 6,218,825 B1 | 4/2001 | Lenhard ................. 324/117 R |
| 6,768,296 B2 * | 7/2004 | Fiedler et al. ........... 324/117 R |
| 6,943,537 B2 * | 9/2005 | Blakely ................... 324/127 |

FOREIGN PATENT DOCUMENTS

| | | |
|---|---|---|
| DE | 3613991 A1 | 9/1986 |
| DE | 3715789 A1 | 12/1988 |
| DE | 29520066 U1 | 12/1995 |
| DE | 19705767 C2 | 8/1998 |
| EP | 0294590 B1 | 8/1993 |
| EP | 0686850 A1 | 12/1995 |
| EP | 0960342 B1 | 1/2003 |
| WO | 9836283 | 3/1998 |
| WO | 2005106506 A1 | 11/2005 |

OTHER PUBLICATIONS

Ogasawara et al., "A Digital Current Sensor for PWM Inverters", IEEE, pp. 949-955.
Sonoda et al., "An ac and dc Current Sensor of High Accuracy", IEEE Transactions on Industry Applications, vol. 28, No. 5, pp. 1087-1094.

* cited by examiner

*Primary Examiner*—Ha Nguyen
*Assistant Examiner*—Tung X Nguyen
(74) *Attorney, Agent, or Firm*—Baker Botts L.L.P.

(57) ABSTRACT

A current sensor comprises a magnetic module, whereby a primary conductor, a compensating winding and a magnetic field probe are magnetically coupled to each other. The primary conductor carries a current to be measured, with a driving circuit, for producing a triangular current, injected into the compensating winding. An evaluation circuit switches the output signal thereof from a first to a second output level and vice versa by a zero crossing of a signal, provided by the magnetic field probe, whereby the output signal is pulse-width modulated, depending on the intensity of the current to be measured.

20 Claims, 2 Drawing Sheets

CURRENT SENSOR

CROSS-REFERENCE TO RELATED APPLICATION

This application is a continuation of co-pending International Application No. PCT/EP2005/004663 filed Apr. 29, 2005, which designates the United States, and claims priority to German application number DE 10 2004 021 495.6 filed Apr. 30, 2004.

TECHNICAL FIELD

The invention relates to a current sensor comprising a magnetic module, wherein a primary conductor, a compensation winding and a magnetic field probe are magnetically coupled to each other, said primary conductor carrying a current to be measured.

BACKGROUND

For measuring direct current and alternating current, the compensation principle is used frequently, in which the magnetic field produced by a measurement current in a magnetic core is compensated by a compensation current in a secondary winding. For controlling the compensation current, a detector is provided in the magnetic circuit, which detector detects the deviation from the zero field. The secondary current is thus a precise image of the primary current to be measured. Compensation current sensors of such type are known by way of example from EP 0294590 B1 or EP 0960342 B1. The advantage of such current sensors is that they have a very high degree of accuracy and practically do not require any intervention in the electric circuit to be measured. On the other hand, the disadvantage is that compensation current sensors require relatively high expenditure.

Tests for battery management modules, which are mounted on the battery pole terminal and which are supposed to have a digital output for connection to data buses (e.g., LIN bus or CAN bus), have shown that the micro controller required in this case, with the analog/digital transducer, reference voltage and the high-precision load resistors represents a formidable expense factor.

However, in order to achieve the required precision, a micro controller would also be necessary in a solution with an analog output (e.g., voltage output) in the low current region particularly for hysteresis determination. In addition, an analog output is interference-prone and a precision reference is required on both the sides so that the output signal regions of the sensor and the analog/digital transducer are attuned to each other in the control unit processing these further.

Sensors having a pulse width-modulated output (PWM output) are also used. Here, a pulse width-modulated output signal (PWM output signal) is generated by converting a linear output signal into a pulse width-modulated signal (PWM signal). A PWM signal is very advantageous per se since it is fail-safe and can be evaluated very easily and cost-effectively in a controller of a control unit processing it further, there being particularly no requirement of any cost-intensive analog-digital converters and precision references. However, the approach for generating a pulse width-modulated output signal from a linear output signal by a corresponding conversion, is disadvantageous in many respects. Considerable additional costs are involved since an additional step, in which precision components are also used, is required for converting the linear output signal into a pulse width-modulated signal. Furthermore, said solution is also problematic in terms of reliability and security. Thus, for example, a fault is feasible in which the pulse width-modulated signal with a duty factor of 1:1 indicates a normal operating state and thus does not indicate any primary current although the sensor arranged in front has failed and there is a possibility of a very high primary current flowing.

SUMMARY

In an embodiment, a current sensor may comprise a magnetic module comprising a primary conductor, a compensation winding, and a magnetic field probe magnetically coupled to each other, said primary conductor carrying a current to be measured, a driving circuit, for producing a triangular current, which is fed into the compensation winding, and an evaluation circuit, switching the output signal of the evaluation circuit from a first to a second output level and vice versa in the case of a zero crossing of a signal provided by the magnetic field probe, said output signal being pulse-width modulated according to the intensity of the current to be measured.

BRIEF DESCRIPTION OF THE DRAWINGS

The invention is explained in detail in the following with reference to the exemplary embodiments illustrated in the figures of the drawing, of which.

DETAILED DESCRIPTION

Figure 1:
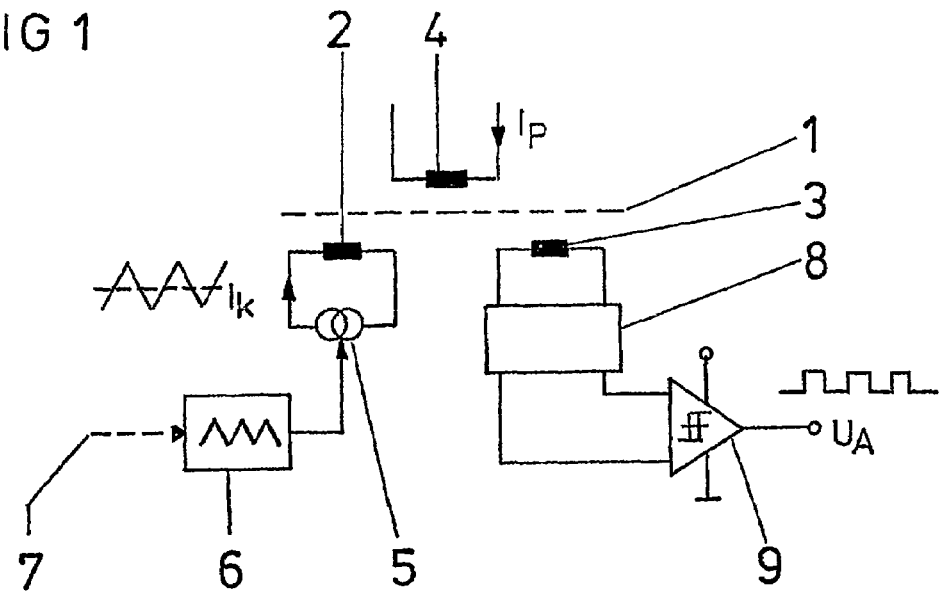
FIG. 1 shows a general block diagram of a current sensor according to an embodiment.

According to an embodiment, the generation of the PWM signal is firmly integrated in the sensor function itself and therefore the costs can be reduced greatly. Secondly, interferences can be recognized easily since either a maximum signal or no signal is emitted, for example, in the case of a total failure. In addition, the current sensor according to an embodiment is characterized by a low expenditure for components, which is reflected in the overall size, in particular. Finally, the disadvantageous characteristics of the magnetic module (for example, hysteresis) are also compensated without any additional expenditure.

In one embodiment, this can be achieved by a current sensor comprising a magnetic module, wherein a primary conductor, a compensation winding and a magnetic field probe are magnetically coupled to each other, said primary conductor carrying a current to be measured. The compensation winding is fed by a driving circuit, which produces a triangular current. Finally, an evaluation circuit is also provided, which switches the output signal thereof from a first to a second output level and vice versa in the case of a zero crossing of a signal provided by the magnetic field probe, the output signal being pulse width-modulated according to the intensity of the current to be measured.

In comparison to the compensation current sensors mentioned at the onset, there is no control circuit present in the current sensor according to an embodiment. Instead, the compensation winding is driven with a preferably bipolar current, which changes triangularly over time. The driving circuit is free-running between the two vertex points ($-I_{max}$, $+I_{max}$) of the triangular current fed into the compensation winding, wherein the frequency can also be selected freely and is oriented to the current to be measured and to the conditions of the magnetic module. The output signal generated by the magnetic field probe signals the saturation of the magnetic field probe beyond the equilibrium condition $N \cdot I_k = I_p$, where N is the number of windings of the compensation winding, $I_k$ is the compensation current and $I_p$ is the primary current.

The magnetic field probe signal enters the linear region in the immediate proximity of the state of equilibrium, then runs very precisely and steeply through the zero crossing, in order to then disappear again in the saturation region in its further course. The zero crossing itself signals the state of equilibrium in which the compensation current and the primary current are at a fixed relation to each other so that a statement can be made about the primary current based on the compensation current. The zero crossing of the magnetic probe signal is used in one embodiment for connecting a comparator, which then changes over in the zero crossing. The comparator can generate a corresponding logical level, for example, depending on the sign of the magnetic probe signal. The sign of the magnetic probe signal results from the respective condition depending on whether the magnetic field generated by the primary current is greater than the magnetic field generated by the compensation winding or vice versa.

The precision of the current sensor according to an embodiment depends on the linearity of the triangular current, which however can be generated usually with high precision and simple means. The measuring range towards high currents is mainly established by the current value at the turning points of the triangular compensation current. The duty factor of the pulse width modulated output signal now practically indicates the current value in fractions of this peak value. The measuring range can be changed randomly by providing different values for the maximum compensation current (extremum).

A significant advantage of the current sensor according to an embodiment is that the hysteresis of the magnetic sensor core used in the magnetic module is always determined automatically. The magnetic sensor core is remagnetized in a constantly defined manner, the pulse width-modulated signal being simply offset by the hysteresis thereof.

In some embodiments, the driving circuit, which feeds the triangular compensation current into the compensation winding, can also work advantageously to ground. The change of sign can then be generated in the zero crossing by a changeover of the current direction through the winding by means of corresponding switch networks. Such switch networks can contain, for example, bridge circuits and the like.

The current sensor according to an embodiment can be used basically with two types of magnetic modules. In one case, for coupling the primary conductor, the compensation winding and the magnetic field probe, the magnetic module comprises a core, which has an air gap, said core enclosing the primary conductor. The magnetic field sensor, which preferably works inductively and then comprises a sensor winding with a sensor core, could however also be implemented in the form of a Hall sensor and is preferably disposed in the air gap.

However, in principle, the current sensor according to an embodiment can also be operated with a closed, toroidal core enclosing the primary conductor, wherein then the core is charged with an additional alternating current or an alternating magnetic field in order to be able to detect the zero crossing of the hysteresis curve of the core. In some embodiments, the alternating current charging or the alternating magnetic field charging can take place, for example, by means of the compensation winding or the winding of an inductive magnetic field probe. The frequency of the additional alternating current charging is substantially higher than that of the pulse width modulation signal in order to ensure a sufficiently high resolution.

In an embodiment according to FIG. 1, a compensation winding 2, a magnetic field probe 3 and a primary conductor 4 are coupled to each other magnetically over a core 1. In the present exemplary embodiment, the magnetic field probe is designed to be inductive. The primary conductor has no windings. However, it may also similarly have a few windings, which are placed on the core 1.

The compensation winding 2 is fed by a controllable bipolar current source 5, which is controlled by a triangle signal generator 6. In the present exemplary embodiment, the triangle signal generator 6 is designed in such a way that its output amplitude can be adjusted using a control signal 7, due to which the amplitude of the compensation current generated by the controllable current source 5 can also be adjusted.

The winding of the inductive current sensor 3 is terminated with a resistor 8, the voltage dropped on it being supplied to a comparator 9, which generates a logical level 1 or 0 depending on the sign of the voltage provided by a sensor electronics assembly 8. In order to prevent the comparator 9 from oscillating in the vicinity of the zero point when interferences occur, the comparator has an electrical hysteresis, which means that the changeover time at the positive and negative edge is different. At the output of the comparator 9, an output signal $U_A$ can then be tapped, which is pulse width-modulated according to the primary current flowing in the primary conductor 4.

Figure 2:
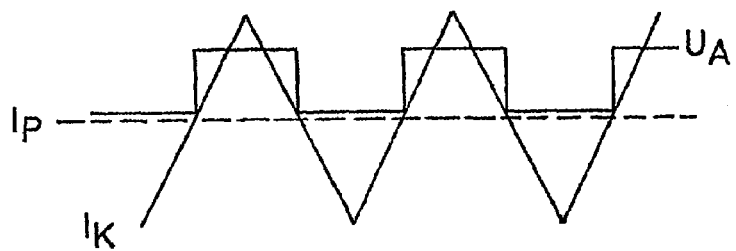
FIG. 2 shows the temporal course of the primary current, compensation current and the pulse width-modulated output signal resulting therefrom in a sensor according to an embodiment shown in FIG. 1.

The course of the primary current $I_p$, the compensation current $I_k$ and the output signal $U_A$ is illustrated in detail in FIG. 2. As can be seen there, the compensation current $I_k$ is triangular between the extremums $+I_k$ max and $-I_k$. On the other hand, the primary current $I_p$ is assumed to be constant in the observation period. The magnetic fields generated by the compensation current $I_k$ and the primary current $I_p$ in the core 1 also have a corresponding course. For the sake of simplicity, it is assumed in the illustration of FIG. 2 that the magnetic fields are 1:1 to their respective currents. Accordingly, the compensation current $I_k$ and, with it, its magnetic field increase slowly, said compensation current being less than the primary current $I_p$. As long as the compensation current is less than the primary current $I_p$, the current sensor 3 emits a signal with a negative sign. This is dictated accordingly by the comparator 9 and is evaluated with the logical level 0 (corresponds to 0V, for example). At the point at which the primary current $I_p$ and the compensation current $I_k$ are equal, that is, their magnetic fields are equal, the comparator 9 tips (apart from a small hysteresis). With the further increase of the compensation current $I_k$, the compensation current $I_k$ is now greater than the primary current $I_p$. Accordingly, the output signal of the magnetic field probe contains a positive sign so that the comparator 9 tips on the logical level 1 (corresponds to 5V, for example). This means that in the case of every zero crossing, the output signal of the comparator 9 changes its level. During the remaining period of time, the comparator remains on a level corresponding to the respective sign of the magnetic field probe signal. The associated course of the output signal $U_A$ of the comparator 9 is likewise illustrated in FIG. 2.

Figure 3:
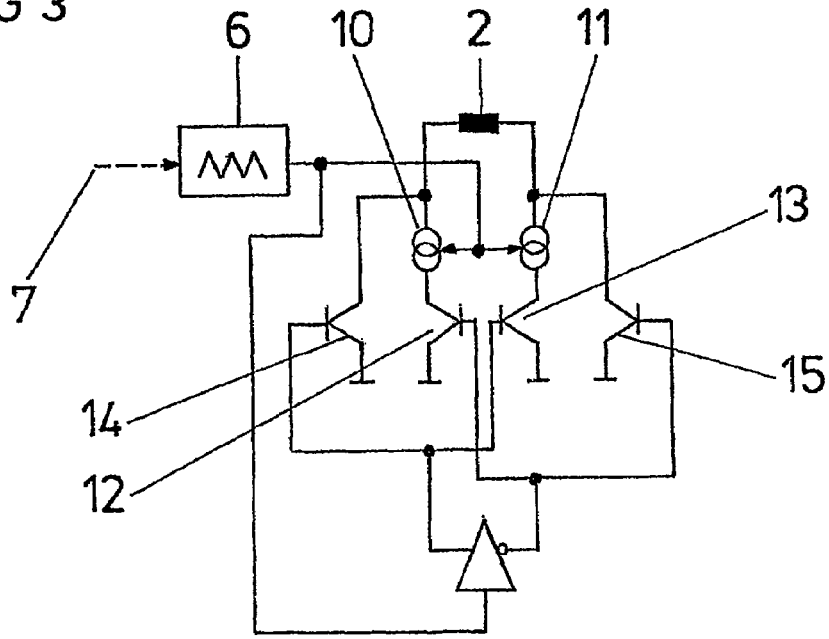
FIG. 3 shows an exemplary embodiment of a driving circuit for a current sensor.

A special embodiment of a driving circuit is shown in FIG. 3. The special advantage of the driving circuit shown is that though the compensation winding 2 shown in FIG. 1 is fed with bipolar current, the driving circuit itself requires only a unipolar voltage supply. For realizing the driving circuit, two unipolar current sources 10 and 11 are provided, which are both controlled similarly by the triangle signal generator 6. One terminal each of the current sources 10 and 11 is connected to a terminal of the compensation winding 2. The respective other terminal of the current sources 10 and 11 can be connected to ground via the load path of a semi-conductor switch 12 or 13.

In addition, the terminals of both the current sources 10 and 11, which terminals are connected to the compensation winding 2, can also be connected to ground using semi-conductor switches 14 and 15. For example, MOS field-effect transistors, bipolar transistors, insolated gate bipolar transistors, thyristors etc. can be taken into consideration as semi-conductor switches. The semi-conductor switches 12 to 15 are driven such that any two semi-conductor switches 12, 14 or 13, 15 connected to the respective current source 10 or 11 block the current, while the respective other pair of semi-conductor switches conduct current, where the respective transistor pair assigned to a current source 10 or 11 is driven inversely to the other transistor pair. As a result, depending on the sign of the triangular signal provided by the triangle signal generator 6, one terminal of the compensation winding 2 lies directly to ground and the respective other terminal is connected to the respective current source. Thus the maximum current available can be used similarly as in the case of a bridge circuit. However, direct bridge circuits or multiple current sources can also be used similarly instead of the arrangement shown.

Figure 4:
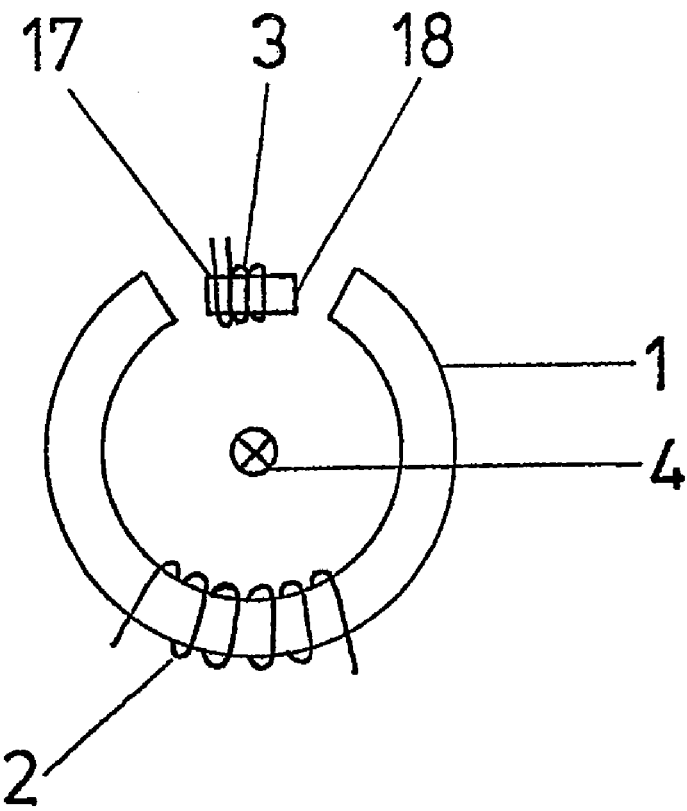
FIG. 4 shows a magnetic module with an air gap for a current sensor according to an embodiment and FIG. 5 shows a magnetic module with a toroidal core for a current sensor according to an embodiment.

A preferred embodiment of a magnetic module is shown in FIG. 4. It is a toroidal core 1a comprising an air gap 16. A winding 17 with core 18 is in the air gap 16, which winding is used as a magnetic field probe 3. The compensation winding 2 is applied on the toroidal core 1a itself. The primary conductor 4 is finally guided through the toroidal core without any windings. Alternatively, the primary conductor can naturally also be wound up on the toroidal core similarly to the compensation winding 2.

Figure 5:
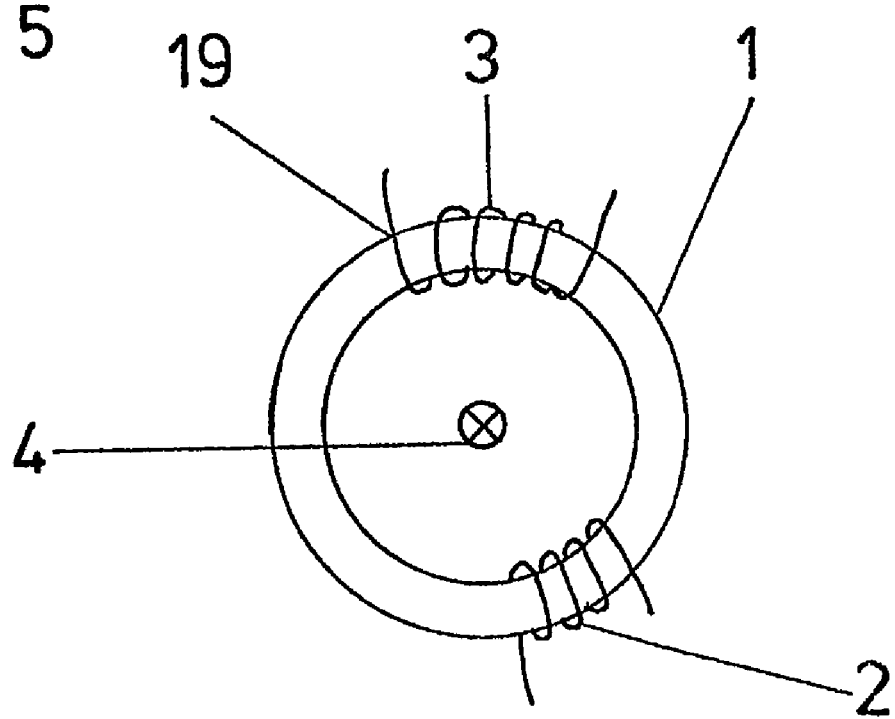

An alternative embodiment of a magnetic module is shown in FIG. 5. This embodiment differs from the one shown in FIG. 4 particularly with regard to the provision of a closed core 1b. A winding 19, which is wound up on the core just as the compensation winding 2, is used as the magnetic field probe 3 here. An additional alternating current is fed into one of the two windings. The frequency of the additional alternating current is supposed to be clearly higher than that of the triangular compensation current. The usual orders of magnitude are, for example, 125 Hz for the compensation current and 500 kHz for the additional alternating current signal.

What is claimed is:

1. A current sensor comprising:
    a magnetic module comprising a primary conductor, a compensation winding, and a magnetic field probe magnetically coupled to each other, said primary conductor carrying a current to be measured,
    a driving circuit, for producing a triangular current, which is fed into the compensation winding, and
    an evaluation circuit, switching the output signal of the evaluation circuit from a first to a second output level and vice versa in the case of a zero crossing of a signal provided by the magnetic field probe, said output signal being pulse-width modulated according to the intensity of the current to be measured.

2. The current sensor according to claim 1, wherein the driving circuit generates a bipolar current.

3. The current sensor according to claim 2, wherein the driving circuit comprises a triangle signal generator for generating a triangular control signal and at least one current source controlled by the control signal.

4. The current sensor according to claim 3, wherein at least one current source generates a unipolar current, to which current source the compensation winding is connected by means of a switch network in one or the other direction depending on the sign of the control signal.

5. The current sensor according to claim 1, wherein the maximum current provided by the driving circuit is adjustable.

6. The current sensor according to claim 1, wherein the evaluation circuit comprises a comparator, which compares the signal provided by the magnetic field probe with a zero point.

7. The current sensor according to claim 6, wherein the comparator has an electrical hysteresis.

8. The current sensor according to claim 6, wherein the evaluation circuit generates a unipolar pulse width-modulated output signal.

9. The current sensor according to claim 1, wherein the magnetic field probe is an inductive sensor.

10. The current sensor according to claim 1, wherein, for the magnetic coupling of the primary conductor, compensation winding and the magnetic field probe, the magnetic module comprises a core with an air gap, which core surrounds the primary conductor.

11. The current sensor according to claim 6, wherein the magnetic field probe is disposed in the air gap.

12. The current sensor according to claim 1, wherein, for the magnetic coupling of the primary conductor, compensation winding and the magnetic field probe, the magnetic module comprises a core, which surrounds the primary conductor completely, an additional magnetic alternating field being fed into said core.

13. The current sensor according to claim 12, wherein the magnetic field probe is wound around the core as a sensor winding.

14. The current sensor according to claim 12, wherein an alternating current is fed into the compensation winding for injecting the additional magnetic alternating field.

15. The current sensor according to claim 1, wherein the evaluation circuit generates a first or a second output level of an output signal depending on the sign of a signal provided by the magnetic field probe, said output signal being pulse-width modulated according to the intensity of the current to be measured.

16. A current sensor comprising:
    a magnetic module comprising a primary conductor, a compensation winding, and a magnetic field probe are magnetically coupled to each other, said primary conductor carrying a current to be measured,
    a driving circuit comprising a triangle signal generator for generating a triangular control signal and at least one current source controlled by the control signal, for producing a bipolar triangular current, which is fed into the compensation winding, and
    an evaluation circuit, switching the output signal of the evaluation circuit from a first to a second output level and vice versa in the case of a zero crossing of a signal provided by the magnetic field probe, said output signal being pulse-width modulated according to the intensity of the current to be measured.

17. The current sensor according to claim 16, wherein at least one current source generates a unipolar current, to which current source the compensation winding is connected by means of a switch network in one or the other direction depending on the sign of the control signal.

18. The current sensor according to claim 16, wherein the maximum current provided by the driving circuit is adjustable.

19. A current sensor comprising:
- a magnetic module comprising a primary conductor, a compensation winding, and a magnetic field probe magnetically coupled to each other, and a core, which surrounds the primary conductor completely, said primary conductor carrying a current to be measured,
- a driving circuit, for producing a triangular current, which is fed into the compensation winding, and
- an evaluation circuit, switching the output signal of the evaluation circuit from a first to a second output level and vice versa in the case of a zero crossing of a signal provided by the magnetic field probe, said output signal being pulse-width modulated according to the intensity of the current to be measured,
- wherein an additional magnetic alternating field being fed into said core.

20. The current sensor according to claim 19, wherein the magnetic field probe is wound around the core as a sensor winding.

* * * * *